United States Patent [19]
Brotherton

[11] Patent Number: 6,025,218
[45] Date of Patent: *Feb. 15, 2000

[54] METHOD OF MANUFACTURING A THIN-FILM ELECTRONIC DEVICE WITH A LAMINATED CONDUCTOR

[75] Inventor: Stanley D. Brotherton, Forest Row, United Kingdom

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/916,775

[22] Filed: Aug. 20, 1997

[30] Foreign Application Priority Data

Aug. 27, 1996 [GB] United Kingdom ............... 9617885

[51] Int. Cl.⁷ ................... H01L 21/00; H01L 21/84
[52] U.S. Cl. ....................... 438/166; 257/353; 257/72
[58] Field of Search ........................ 438/168, 219, 438/166; 257/66

[56] References Cited

U.S. PATENT DOCUMENTS 5,130,829  7/1992  Shannon ........................... 359/59
5,563,426  10/1996  Zhang et al. ...................... 257/66
5,851,862  12/1998  Ohtani et al. ..................... 438/166

FOREIGN PATENT DOCUMENTS 0683525  11/1995  European Pat. Off. .

*Primary Examiner*—Wael Fahmy
*Assistant Examiner*—William David Coleman
*Attorney, Agent, or Firm*—Tony E. Piotrowski

[57] ABSTRACT

A method of manufacturing a flat panel display or other electronic device comprising thin-film circuit elements includes the steps of depositing and patterning a less conductive film (2) and metal film (1) to provide a laminated conductor, depositing and patterning semiconductor material to provide a circuit element island (50), and then directing an energy beam (100) towards the island (50) to crystallise the semiconductor material for the island (50). In order to protect the metal film (1) from the energy beam (100) the less conductive film (2) is deposited on the metal film (1), is of a semiconductor material absorptive of the energy beam (100), and is deposited to a thickness which is larger than its melt depth (d) when heated by the energy beam (100) during the crystallisation of the semiconductor material of the island (50). When the metal film (1) is not protected in this way, then the stresses occurring can degrade the integrity of the metal film (1) and any overlying insulating films (3) and/or semiconductor islands (50).

19 Claims, 3 Drawing Sheets

METHOD OF MANUFACTURING A THIN-FILM ELECTRONIC DEVICE WITH A LAMINATED CONDUCTOR

BACKGROUND OF THE INVENTION

This invention relates to methods of manufacturing an electronic device comprising a thin-film circuit element having a crystalline semiconductor region. The device may be a flat panel display (for example, a liquid crystal display), or a large-area image sensor, or several other types of large-area electronic device (for example, a thin-film data store or memory device, or a thermal imaging device). The invention also relates to devices manufactured by such methods.

There is currently much interest in developing thin-film field-effect transistors (hereinafter termed TFTs) and/or other thin-film circuit elements on glass and other insulating substrates for large-area electronics applications, for example flat panel displays. Such TFTs fabricated with amorphous or polycrystalline semiconductor films may form the switching elements of a cell matrix, for example, in a flat panel display as described in United States Patent Specification U.S. Pat. No. 5,130,829 or in published European Patent Application EP-A-0 683 525. The whole contents of U.S. Pat. No. 5,130,829 and EP-A-0 683 525 are hereby incorporated herein as reference material. A more recent development involves the fabrication and integration of thin-film circuit elements (usually with polycrystalline silicon), for example as integrated drive circuits for the matrix of a flat-panel display. Where high mobility is desired, for example for fast switching applications, crystalline semiconductor regions are generally used for the thin-film circuit elements.

The second embodiment of the method illustrated in FIG. 4 of EP-A-0 683 525 describes the manufacture of an electronic device in accordance with the non-characterising preamble features of the present claim 1. Thus, FIG. 4 shows a thin-film circuit element in the form of a TFT 22 having a crystalline semiconductor channel region in a semiconductor thin-film island 25 on a substrate 21. The device of FIG. 4 has laminated conductors 23 and 23a each comprising a metal film 31 on a less conductive film 30. The conductor 23a and a part of the conductor 23 extend on an area of the substrate 21 not covered by the island 25. The conductor 23 forms a gate line for the TFT 22, whereas the conductor 23a forms an auxiliary line. These laminated conductors 23 and 23a are covered by an insulating film 24 which provides the gate dielectric film below the TFT island 25.

The manufacturing method described in the second embodiment of FIG. 4 of EP-A-0 683 525 comprises the steps of depositing and patterning the less conductive film 30 and the metal film 31 to provide the laminated conductors 23 and 23a, depositing the insulating film 24, and depositing and patterning semiconductor material to provide the island 25. As described in lines 10 to 13 of column 10 of EP-A-0 683 525, the amorphous semiconductor material of the island 25 is crystallised by irradiation with a laser beam so as to form a polycrystalline channel region for the TFT 22. In this example, the less conductive film 30 is 200 nm of Ti, and the metal film 31 of smaller resistance value is 50 nm of Al. In the other embodiments, the less conductive film may be of a semiconductor material, for example silicon, and the metal film of smaller resistance value may be one or more of the metals Al, Mo, Ti, W, Cr, Ni and Ta.

In all the embodiments and modifications disclosed in EP-A-0 683 525, the metal film is always provided on top of the less conductive film, and never vice versa. The less conductive film is of a sufficient thickness to ensure the physical continuity of the laminated conductor, whereas the metal film lowers the line resistance and is overlaid thinly enough on the less conductive film to prevent the occurrence of surface variations such as hillocks during its deposition.

The use of laminated conductors comprising a metal film 37 on top of a semiconductor film 55 is also disclosed in U.S. Pat. No. 5,130,829. U.S. Pat. No. 5,130,829 also discloses the provision of a metal light shield for each of the switching circuit elements of its device matrix. FIGS. 5 and 6 and their description in column 7 of U.S. Pat. No. 5,130,829 illustrate switching elements in the form of polycrystalline silicon TFTs 11 formed in islands on an insulating film 56 which covers the metal light shield 45 and most of its connection track 46. The light shield 45 may be of a refractory material such as Mo or W. As described in lines 7 to 13 of column 7, the semiconductor island 50 may be crystallised with a laser beam, in which case it is suggested that a non-refractory metal may be used, for example Al, for the light shield 45 and its connection track 46.

SUMMARY OF THE INVENTION

According to the present invention there is provided a method of manufacturing an electronic device comprising a thin-film circuit element having a crystalline semiconductor region in a semiconductor thin-film island on a substrate, and a laminated conductor at least a part of which extends on an area of the substrate not covered by the island, the laminated conductor comprising a metal film and a less conductive film, the method comprising the steps of depositing and patterning the less conductive film and the metal film to provide the laminated conductor, depositing and patterning semiconductor material to provide the island, and then directing an energy beam towards the island to crystallise the semiconductor material for the crystalline semiconductor region, characterised in that the less conductive film is deposited on the metal film, is of a semiconductor material absorptive of the energy beam, and is deposited to a thickness which is larger than its melt depth when heated by the energy beam during the crystallisation of the semiconductor material of the island, thereby protecting the metal film from the energy beam during the crystallisation of the semiconductor material of the island.

Although satisfactory laser-crystallised TFTs can be made by the prior art techniques the present inventor has found that an improvement is possible when the laminated conductor is constructed in accordance with the present invention. This improvement is not achievable with prior art laminated conductors in which the metal film is present on top of the semiconductor or other film.

Thus, it appears that some laser damage to the part of the conductor not covered by the island may occur in the prior art processes due to thermally induced stresses, particularly but not exclusively when the metal film is of chromium or another non-refractory metal and covered by an insulating film. The TFT itself can be degraded when the metal film and/or the insulating film extends also below the island being crystallised. In extreme cases, the metal film of the conductor may crack and may exhibit a crazed appearance upon cooling after removal of the laser beam. Similar problems may occur when a light beam from high intensity lamps is used for the crystallisation instead of a laser.

Thus, in the prior art processes, some degradation may occur in, for example, the light shielding properties and/or in the electrically conductive properties of such a prior art conductor. Furthermore, where the island being crystallised is present on an insulating film on a part of the conductor, the circuit element may have a much higher than expected leakage current, particularly but not exclusively when a crack in the conductor and/or insulator extends beneath the island. The present inventor has discovered that an improved quality for the metal film of the conductor and for the crystalline island material over such a conductor may be obtained when, in accordance with the present invention, the semiconductive material absorptive of the energy beam is deposited on the metal film to a thickness which is larger (for example at least 1.5 times) than its melt depth when heated by the energy beam, thereby providing a sufficient buffer to protect the metal film of the conductor from the energy beam during the crystallisation of the semiconductor material of the island.

The present invention can be employed to particular advantage for manufacturing methods in which the island is crystallised on an insulating film deposited on a part of the laminated conductor comprising the film of semiconductor material on the metal film. The electronic device may be an opto-electronic device (for example a display) involving light in its function, and the laminated conductor may serve as a light shield under the whole of the island to shield the circuit element of the island from light transmitted via the substrate. When the circuit element is a thin-film transistor having a bottom gate, the insulating film may form a gate dielectric of the transistor, and the laminated conductor comprising the film of semiconductor material on the metal film may form a gate electrode of the transistor.

In a particular embodiment the less conductive film may be of silicon, and the metal film may be of chromium or aluminium or another non-refractory metal. The energy beam is advantageously of ultraviolet wavelength from a pulsed laser. Thus, the present invention may be applied to device manufacture using well-established silicon-based thin-film process technology. Furthermore compatible thin-film process techniques (for example etching, adhesion to underlying and overlying layers etc) are well established and well understood for non-refractory metals such as Cr and Al. However the invention may also be applied with less commonly used materials, for example with other semiconductor materials than silicon and with refractory metals. Although refractory metals might be expected to be more thermally resilient than nonrefractory metals, it is not obvious that the problems of temperature induced stress during the laser semiconductor crystallisation step would be absent for refractory metals, and so it may still be advantageous to include an protective semiconductor film thereon in accordance with the present invention. However, the thin-film process techniques for refractory metals are not as well established as for the more commonly used metals such as Cr and Al. Hence a primary application of the present invention is with the more commonly used materials.

These and other features of the present invention, and their advantages, are illustrated specifically in embodiments of the invention now to be described, by way of example, with reference to the accompanying diagrammatic drawings.

Figure 1:
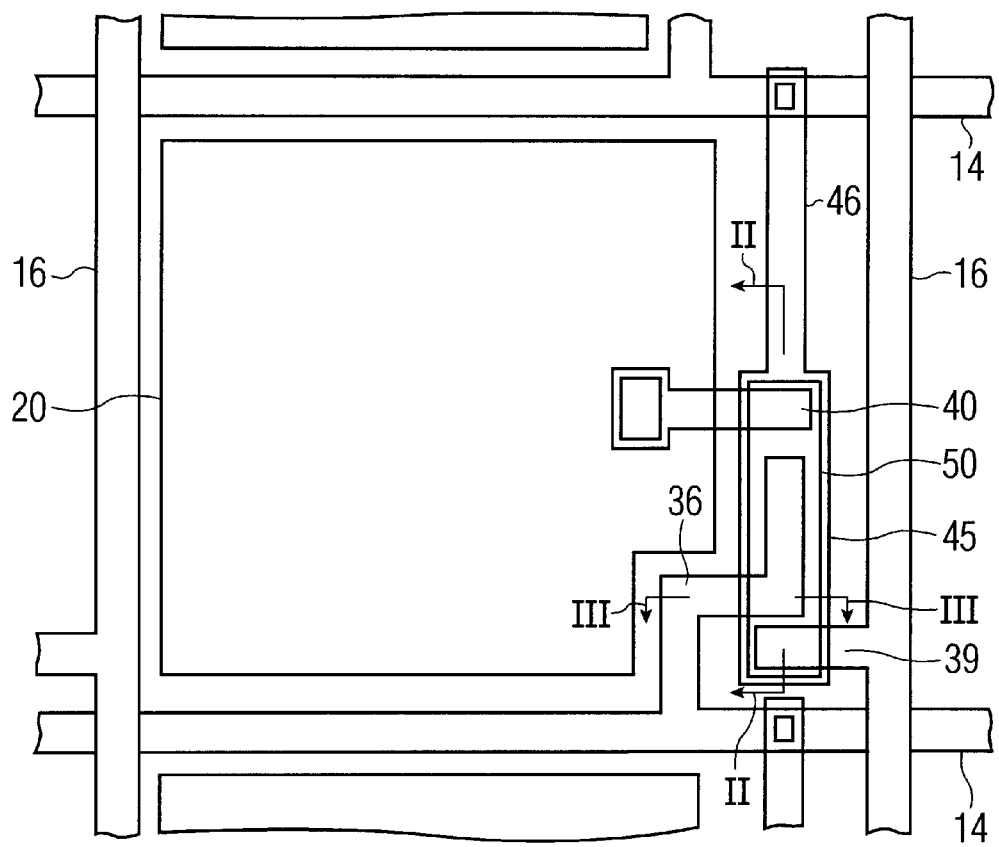
FIG. 1 is a plan view of part of a large-area electronic device manufactured by a method in accordance with the present invention.

It should be noted that FIGS. 1 to 5 are diagrammatic and not drawn to scale. Relative dimensions and proportions of parts of these Figures have been shown exaggerated or reduced in size, for the sake of clarity and convenience in the drawing. The same reference signs are generally used to refer to corresponding or similar features in different embodiments and to the different TFT structures of FIG. 7.

DESCRIPTION OF THE PREFERRED EMBODIMENTS

In order to illustrate the differences between the present invention and the prior art, the plan view of FIG. 1 is based on the plan views of active-matrix liquid-crystal display devices illustrated in the embodiments of U.S. Pat. No. 5,130,829. The features derived from U.S. Pat. No. 5,130,829 should be understood as non-limiting examples of the context in which the present invention may be employed. Thus, by way of example, the device of FIG. 1 is an active-matrix liquid-crystal display device including on an insulating substrate 30, a row and column array of picture elements 20, associated switching TFTs of islands 50, and sets of row and column address conductors 14 and 16 respectively to which selection and data signals are respectively applied. Each switching TFT has a source electrode 39 connected to the associated column conductor 16, a drain electrode 40 connected to the picture element electrode 20, and a gate electrode 36 connected to the associated row conductor 14. Each of these switching TFTs is provided with a metal light shield 45 which may be connected to a row conductor 14 or may have a separate connection. Other details of the device of FIG. 1 can be readily understood from the background material in U.S. Pat. No. 5,130,829.

Figure 2:
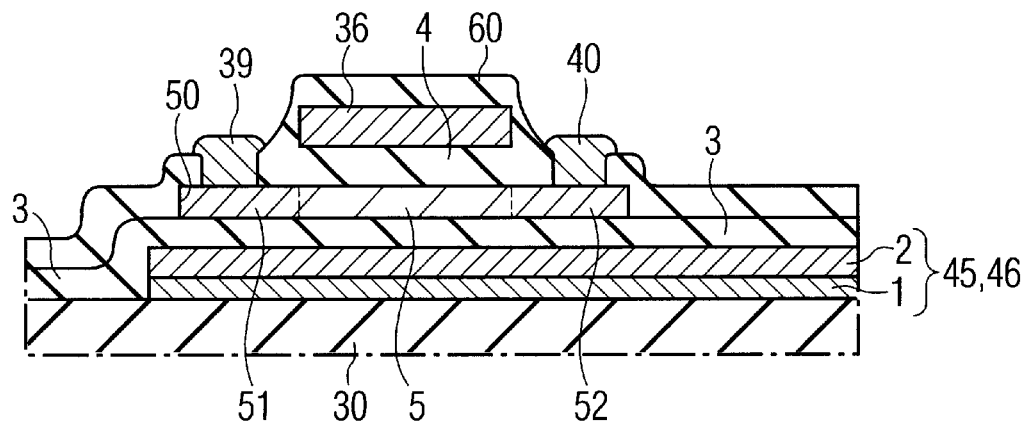
FIG. 2 is a cross-section on the line II—II of FIG. 1 of a first embodiment of a device manufactured in accordance with the present invention.
Figure 3:
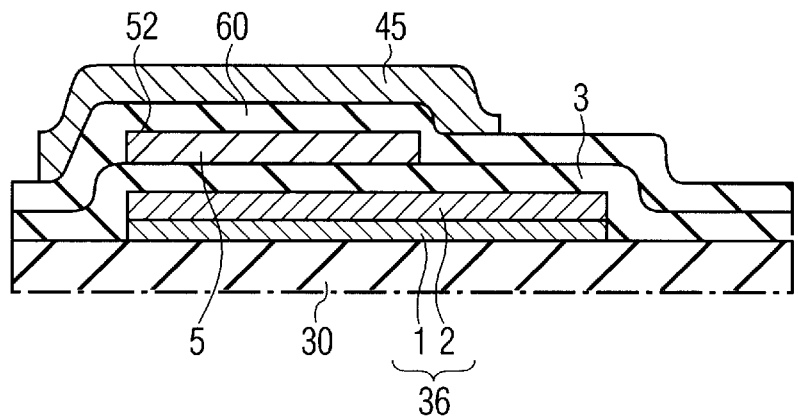
FIG. 3 is a cross-section on the line III—III of FIG. 1 of a second, alternative embodiment of a device manufactured in accordance with the present invention.

FIG. 1 is drawn extremely diagrammatically in such a way as to illustrate two alternative embodiments of the present invention, namely those of FIGS. 2 and 3. In the embodiment of FIG. 2 the light shield 45 is present under the whole of the island 50 to shield the TFT from light transmitted via the substrate 30. The TFT of FIG. 2 has a top gate 36 on a gate dielectric layer 4 on the semiconductor island 50. This TFT configuration is similar to that illustrated in FIG. 6 of U.S. Pat. No. 5,130,829. The TFT has a polycrystalline silicon channel region 5 between doped polycrystalline silicon source and drain regions 51 and 52 of the island 50. An upper insulating film 60 extends over the thin-film structure on the substrate 30. The TFT of FIG. 3 has its metal light shield 45 on the upper insulating film 60 and overlying the polycrystalline silicon island 50. The island 50 again comprises the TFT channel region 5 and its source and drain regions 51 and 52 (not present in the cross-sectional view of FIG. 3). This TFT of FIG. 3 has a bottom gate 36 which is separated from the island 50 by a gate dielectric film 3.

Both the TFT of FIG. 2 and the TFT of FIG. 3 constitute a thin-film circuit element having crystalline semiconductor regions 5,51,52 in a semiconductor thin-film island 50 on a substrate 30. The device of FIG. 2 and the device of FIG. 3 also have a laminated conductor comprising a metal film 1 and a semiconductor film 2. In FIG. 2 the laminated conductor is the light shield 45 and an integral connection track 46 to, for example, a row conductor 14. In FIG. 3 the laminated conductor is the bottom gate electrode 36 and its connection track to a row conductor 14. In both FIGS. 2 and 3 an insulating film 3 covers at least a part of the laminated conductor 1,2 and extends below the semiconductor island 50. Furthermore, the connection track part of the laminated conductor 1,2 in both FIGS. 2 and 3 extends on an area of the substrate 30 not covered by the island 50. Because FIGS. 2 and 3 have a similar structure of the island 50 in relation to a laminated conductor comprising films 1 and 2, the manufacturing stages used for both FIGS. 2 and 3 may each comprise the steps of depositing and patterning the semiconductor film 1 and metal film 2 to provide the laminated conductor (see FIG. 4), depositing the insulating film 3, depositing and patterning semiconductor material to provide the island 50, and then directing an energy beam 100 towards the island 50 to crystallise the semiconductor material for the crystalline semiconductor regions 5,51 and 52 (see FIG. 5).

In a situation in which the semiconductor material of the island 50 is absorptive of the energy beam 100 incident thereon, then the island 50 may protect the underlying part of the laminated conductor from the beam 100. However, as described above and as shown in FIG. 5, at least the connection track part of the laminated conductor 1,2 extends on an area of the substrate 30 beyond the island 50 and so cannot be protected from the beam 100 by the island 50. The present invention provides protection for the metal film 1 of the laminated conductor from the energy beam 100 during the crystallisation of the semiconductor material of the island 50. This protection is achieved by depositing the film 2 on the metal film 1 (and not vice versa), by the film 2 being of a semiconductor material absorptive of the energy beam 100, and by the film 2 being deposited to a thickness which is larger than its melt depth when heated by the energy beam 100 during the crystallisation of the semiconductor material of the island 50. A particular example of these method steps will now be described with reference to FIGS. 4 and 5.

Figure 4:
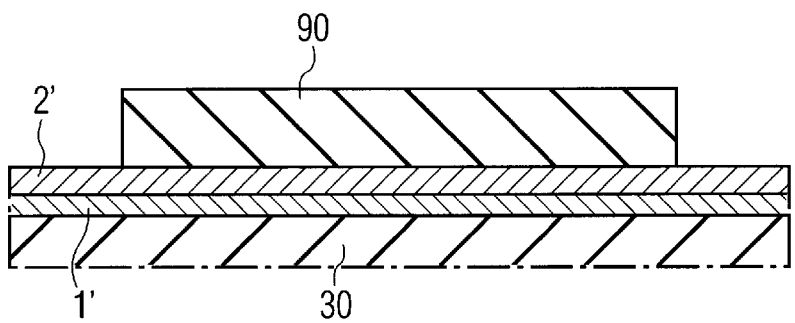
FIGS. 4 and 5 are cross-sectional views of the device part of either FIG. 2 or FIG. 3, at successive stages in its manufacture by a method in accordance with the present invention.

In this particular example, chromium may be deposited to a thickness of, for example, about 100 nm or more to form a continuous metal film 1' on the substrate 30. Amorphous silicon material may then be deposited to a thickness of, for example, about 100 nm or more to form a continuous film 2' on the metal film 1'. A known photolithographic and etching process may then be carried out to shape the films 1' and 2' into the desired pattern for the laminated conductor 45,46 of FIG. 2 or 36 of FIG. 3. FIG. 4 illustrates an intermediate step in this photolithographic and etching process, in which a photoresist pattern 90 is present on the continuous films 2' and 1'. After etching the films 2' and 1' into the desired pattern for the laminated conductor 36 or 45,46, the photoresist pattern 90 is dissolved in known manner. Silicon oxide and/or silicon nitride is then deposited to form the insulating film 3 covering the laminated conductor. The thickness and composition of the film 3 depends on whether it is to provide the gate dielectric of the TFT of FIG. 3 or an underlying insulating film of the TFT of FIG. 2. Depending on whether a degree of back-gating is desired with the light shield 45 of FIG. 2, the thickness of the insulating film 3 for the FIG. 2 structure is typically larger than that for the FIG. 3 structure.

Figure 5:
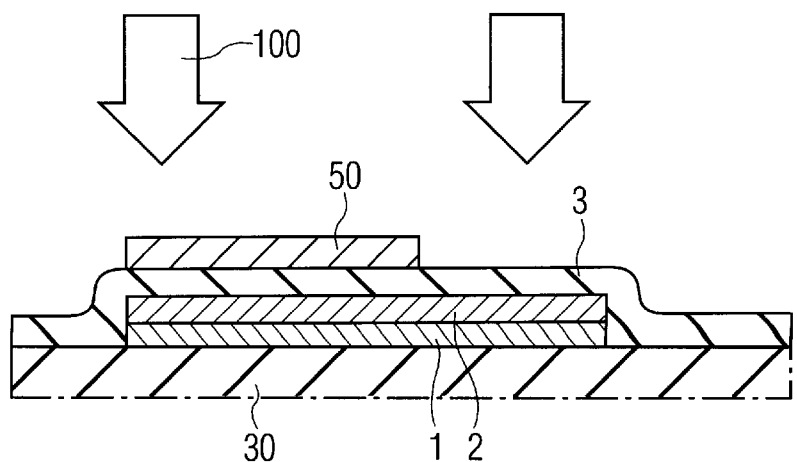

A silicon island 50 is then formed by depositing amorphous silicon material in known manner on the insulating film 3 and patterning it using a known photolithographic and etching process. The thickness of the deposited silicon material forming the island 50 is typically less then 100 nm, for example about 50 nm. FIG. 5 illustrates a laser treatment for crystallising the semiconductor material of the island 50. The energy beam 100 is typically a pulsed laser beam of an ultra-violet wavelength generated by an excimer laser. A pulsed laser beam 100 of ultra-violet wavelength has the known advantage of permitting control of its absorption depth in the semiconductor material of the island 50 and also control of the melt depth of this semiconductor material when heated by the absorption of this pulsed laser energy. Useful laser wavelengths are 248 nm from a KrF laser, or a wavelength of 308 nm from an XeCl laser, or a wavelength of 351 nm from an XeF laser.

Figure 6:
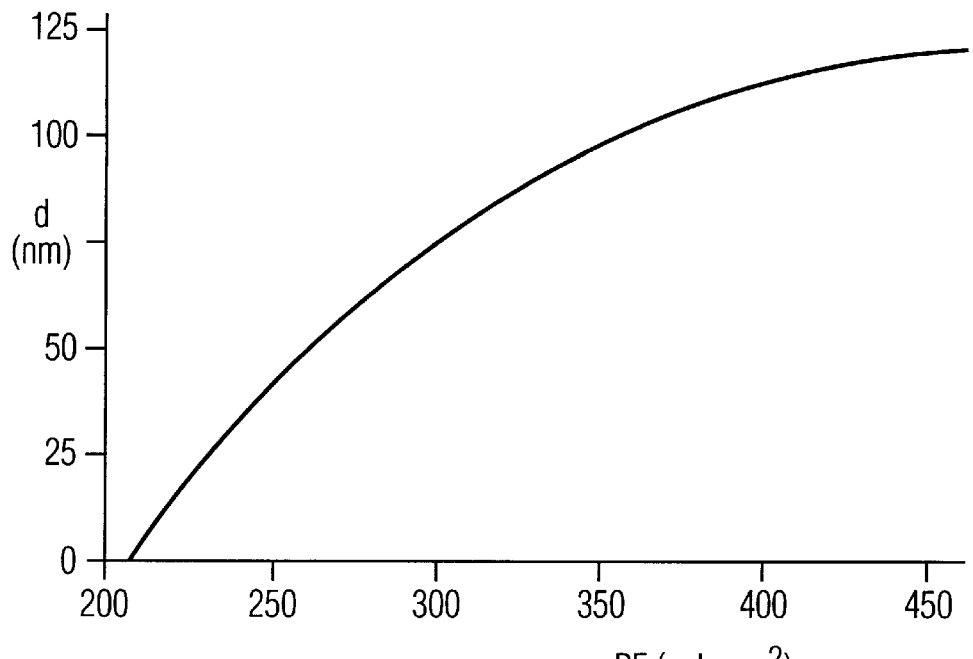
FIG. 6 is a graph of the melt depth (d) in nanometres (nm) for an amorphous silicon film as a function of the pulse energy (PE) in mJ.cm$^{-2}$ for a laser pulse from an excimer laser.

The thicknesses of the silicon material in both the island 50 and the film 2 are larger than the absorption depth of the laser beam 100 in this material. The thickness of the semiconductor material in the island 50 is slightly less than a thermal diffusion length, as a result of which the silicon material of the island 50 is locally melted through its thickness by absorption of the laser beam 100. The semiconductor film 2 is, however, much thicker. The thickness of the silicon film 2 is larger than a thermal diffusion length and larger than the depth d over which the silicon material is melted by the laser beam 100. FIG. 6 is a graph showing the relationship between the melt depth d in a thick amorphous silicon film when exposed to a pulse of energy PE from a KrF laser. The graph is based on measurements of the depth over which large crystal grains are present in this thick film when cooled after exposure to the laser pulse, this depth being assumed to be a measure of the melt depth. As can be seen from FIG. 6, the melt depth d is between 40 nm and 50 nm with a pulse energy of about 250 mJ.cm$^{-2}$ and is almost 125 nm with a pulse energy of about 450 mJ.cm$^{-2}$. The thickness of the protective silicon film 2 is larger than the melt depth d, so as to limit heat flow from the molten surface part to the underlying metal film 1. Typically at least 50 nm of silicon material may remain unmelted below the molten silicon produced by the laser beam in the areas of the film 2 not covered by the silicon island 50. Although the molten surface part of the film 2 is at a temperature in excess of 1000° C., the underlying unmolten part of the film 2 acts as a thermal barrier between this high temperature molten surface part and the underlying metal film 1. With the process parameters typically used in silicon thin-film device technology, the thickness of the protective silicon film 2 will typically be 1.5 or more times larger than the melt depth d so as to leave a sufficient unmelted portion as a thermal buffer. For example, the thickness of the semiconductor film 2 may be about 100 nm or more when d=50 nm, or may be about 150 nm or more when d=100 nm, or may be about 170 nm or more when d=120 nm. The laser beam itself is absorbed in the upper part of the silicon film 2 and so does not penetrate to significant extent to the underlying metal film 1, and the unmelted lower part of the silicon film 2 acts as a thermal buffer and so avoids excessive heating of the metal film 1. By this means the metal film 1 is protected from damage by the energy beam 100.

Figure 7:
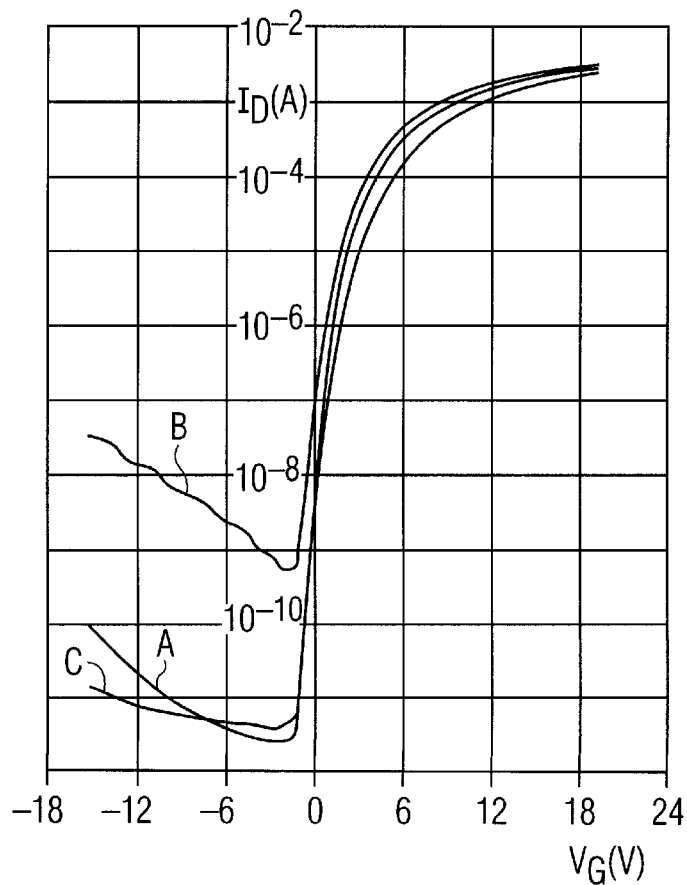
FIG. 7 is a graph of drain current ($I_D$) in amps (A) for TFTs of three different test structures A, B and C as a function of gate voltage ($V_G$) in volts (V), structure C being in accordance with the present invention.

FIG. 7 illustrates the effectiveness of the silicon film 2 in protecting a metal film 1 of Cr from damage by the energy beam 100. For curves B and C, the Cr film 1 extended below a SiO$_2$ film 3, and this Cr and SiO$_2$ structure was present beside a TFT island 50 and also extended under the island 50. The TFT was of the type having a top gate 36, i.e. a polycrystalline silicon TFT arrangement such as is shown in FIG. 2. The Cr film 1 of the TFT of curve C was covered with an amorphous silicon film 2 in accordance with the invention. The TFT of curve B had no silicon film 2 covering its Cr film 1 and so was not in accordance with the invention. Curve A was for a comparative control device having the same TFT structure as for curves B and C but without any Cr film 1 under or near this TFT. These three TFT structures of curves A, B and C were formed side-by-side on a $SiO_2$-coated glass substrate 30. The islands 50 of all three TFTs were crystallised by KrF laser pulses having a pulse energy PE of 260 $mJ.cm^{-2}$. Thus, the melt depth d for the silicon film 2 of curve C and for the islands 50 of curves A, B and C was about 40 nm. The measurements of drain current $1_D$ with gate voltage $V_G$ shown in FIG. 7 are dark current measurements (i.e. with no illumination of the TFT) and were taken with a drain voltage of 5 V. The TFTs of curves A, B and C were test structures, each having a $SiO_2$ gate dielectric 4 of 150 nm thickness, and a polycrystalline Si channel 5 of 50 µm width, 6 µm length, and 40 nm thickness.

The degradation in off-state leakage current (i.e. at negative values of $V_G$) is apparent in FIG. 7. The limiting off-currents of a TFT arise from a phonon assisted tunnelling mechanism and are consequently very sensitive to the drain field. The small differences in leakage current observed between curves A and C are probably due to drain field relief in the TFT of curve C, the underlying Si/Cr layer 1,2 of which may be acting somewhat as a back gate. The TFT of curve B having a Cr film 1 unprotected by any silicon film 2 has a much higher leakage current than that of curve C, i.e. at least 3 orders of magnitude higher. The reason for this degradation in the TFT with unprotected Cr is believed to be due to stresses set up in the structure when the Cr is directly irradiated by the beam 100. The Cr film 1 not protected by an overlying silicon film 2 will experience intense heating by the beam 100, and there is a mismatch in thermal expansion coefficients between the Cr and the adjacent layers of $SiO_2$. This effect may also be exacerbated by the very rapid nature of the heating due to the excimer pulse duration being only 20–30 ns. The overlying $SiO_2$ film 3 may also have anti-reflection properties to the beam 100, so also exacerbating the problems. When carefully examined under a microscope, some evidence of these stresses were visible in terms of fine cracks in the Cr film and/or the capping $SiO_2$ film 3. These damaging stresses were absent in the a-Si coated Cr films 1,2 of the TFT of curve C, because the laser energy was absorbed directly by the Si film 2, thereby minimising the temperature rise in the Cr film 1. Furthermore the Si film 2 has a better thermal match to the capping oxide film 3.

Although the damage to a metal film 1 exposed to a laser beam 100 may be more acute where an insulating film 3 is present on and over the surface of the metal film 1, the present invention may also be used in situations where the laminated conductor (of film 2 on film 1) exposed to the beam 100 is not covered by an insulating film 3. Such a laminated conductor may be located side-by-side with the island 50 being crystallised.

In the arrangement of FIG. 5, the main protective role for the thick semiconductor film 2 on the metal film 1 is in areas of the substrate 30 where the metal film 1 is outside the area covered by the island 50. However, the thick semiconductor film 2 is usually retained on the metal film 1 even in the areas covered by the island 50, because extra photolithographic and etching steps would be required to remove the thick semiconductor film 2 from these areas. Furthermore, it should be noted that the thick semiconductor film 2 may perform the same protective role even in the areas under the island 50, if the island 50 is not wholly absorptive of the beam 100 and/or if there are pin-hole defects in the island 50 transmissive of the beam 100.

After crystallising the semiconductor material of the island 50 with a laser beam 100 in this manner in accordance with the present invention, the film structure of FIG. 4 may then be processed in known manner to provide the final device structure of FIGS. 1 and 2 or the final device structure of FIGS. 1 and 3. Although FIGS. 1 and 2 show only a light shield 45 beneath the TFT island 50, a light shield may also be provided over the island 50, for example by extending the source electrode 39 over the film 60 over the insulated gate 36.

In the device illustrated by way of example in FIGS. 1 and 2, the light shield 45 is wider than the TFT island 50, and its track 46 extends parallel to the direction of the TFT channel length between the TFT source and drain regions 51 and 52. However, the TFT may have a different orientation, such that the track 46 extends transverse to the TFT channel length. In this case a self-aligned process may be used, such that the width of the light shield 45 corresponds to the length of the channel region 5 between the source and drain regions 51 and 52 and/or to the width of the gate 36 controlling the channel region 5. Thus, either the light shield 45 or gate 36 may be used in known manner as a photomask during the definition of other regions. The track 46 is still a laminated structure in accordance with the invention, comprising the semiconductor film 2 on the metal film 1.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during prosecution of the present application or of any further application derived therefrom.

I claim:

1. A method of manufacturing an electronic device comprising a laminated conductor on a substrate, an insulating film covering at least a part of the laminated conductor, and a thin-film circuit element having a crystalline semiconductor region in a semiconductor thin-film island on the insulating film, the laminated conductor comprising a metal film and a less conductive film and extending at least part on an area of the substrate not covered by the island, wherein the method comprises the steps of:

(a) depositing the less conductive film on the metal film to provide the material for the laminated conductor, the less conductive film being of a given semiconductor material selected to have an energy absorption characteristic, and being deposited to a given thickness, to provide the protection described in step (e), (b) patterning the less conductive film and the metal film to provide the laminated conductor, (c) depositing the insulating film to cover at least part of the laminated conductor and an adjacent area of the substrate, (d) depositing and patterning a film of semiconductor material to provide the island on at least a part of the insulating film, and (e) directing an energy beam towards the island to crystallize the semiconductor material of the island so as to provide the crystalline semiconductor region of the thin-film circuit element, the energy beam being incident also on part of the laminated conductor not covered by the island, during this step (e) the metal film being protected from the energy beam by the given semiconductor material of the less conductive film being absorptive of the energy beam and by the given thickness of the less conductive film being greater than its melt depth when heated by the energy beam.

2. A method as claimed in claim 1, further characterised in that the island is formed on the insulating film on a part of the laminated conductor comprising the less conductive film of semiconductor material on the metal film.

3. A method as claimed in claim 2, further characterised in that the electronic device is an opto-electronic device involving light in its function, and the laminated conductor serves as a light shield under the whole of the island to shield the circuit element of the island from light transmitted via the substrate.

4. A method as claimed in claim 2, further characterised in that the circuit element is a thin-film transistor, the insulating film forms a gate dielectric of the transistor, and the laminated conductor comprising the less conductive film of semiconductor material on the metal film forms a gate electrode of the transistor.

5. A method as claimed in claim 1, further characterised in that the thickness of the absorptive semiconductor material of the less conductive film is at least 1.5 times as large as its melt depth.

6. A method as claimed in claim 1, further characterised in that the less conductive film is of silicon, and the metal film is of chromium.

7. A method as claimed in claim 1, further characterised in that the energy beam is of ultraviolet wavelength from a pulsed laser.

8. A method of manufacturing an electronic device comprising a thin-film circuit element having a crystalline semiconductor region in a semiconductor thin-film island on a substrate, and a laminated conductor at least part of which extends on an area of the substrate not covered by the island, the laminated conductor comprising a metal film layer and a less conductive film layer, said method comprising the steps of:

depositing and patterning the less conductive film and the metal film to provide the laminated conductor;

depositing and patterning semiconductor material to provide the island separate from the laminated conductor and leaving uncovered at least a part of the laminated conductor;

directing an energy beam towards the island to crystallize the semiconductor material for the crystalline semiconductor region, the energy beam being incident also on the part of the laminated conductor not covered by the island, wherein the less conductive film deposited on the metal film is of a semiconductor material absorptive of the energy beam, and is deposited to a thickness which is larger than its melt depth when heated by the energy beam during the crystallization of the semiconductor material of the island, so as to protect the metal film that is not covered by the island from the energy beam during the crystallization of the semiconductor material of the island.

9. A method as claimed in claim 8, further characterized in that the less conductive film is of silicon, and the metal film is of chromium.

10. A method as claimed in claim 8, further characterized in that the energy beam is of ultraviolet wavelength from a pulsed laser.

11. A method as claimed in claim 8, further characterized in that, before depositing the semiconductor material for the island, an insulating film is deposited to cover at least a part of the laminated conductor and to extend below the island.

12. A method as claimed in claim 11, further characterized in that the island is formed on the insulating film on a part of the laminated conductor comprising the less conductive film of semiconductor material on the metal film.

13. A method as claimed in claim 12, further characterized in that the electronic device is an opto-electronic device involving light in its function, and the laminated conductor serves as a light shield under the whole of the island to shield the circuit element of the island from light transmitted via the substrate.

14. A method as claimed in claim 12, further characterized in that the circuit element is a thin-film transistor, the insulating film forms a gate dielectric of the transistor, and the laminated conductor comprising the less conductive film of semiconductor material on the metal film forms a gate electrode of the transistor.

15. A method as claimed in claim 8, further characterized in that the thickness of the absorptive semiconductor material of the less conductive film is at least 1.5 times as large as its melt depth.

16. A method as claimed in claim 15, further characterized in that the energy beam is of ultraviolet wavelength from a pulsed laser.

17. A method as claimed in claim 15, further characterized in that, before depositing the semiconductor material for the island, an insulating film is deposited to cover at least a part of the laminated conductor and to extend below the island.

18. A method as claimed in claim 17, further characterized in that the island is formed on the insulating film on a part of the laminated conductor comprising the less conductive film of semiconductor material on the metal film.

19. A method as claimed in claim 18, further characterized in that the electronic device is an opto-electronic device involving light in its function, and the laminated conductor serves as a light shield under the whole of the island to shield the circuit element of the island from light transmitted via the substrate.

* * * * *